United States Patent [19]
Kinoshita et al.

[11] Patent Number: 5,795,452
[45] Date of Patent: Aug. 18, 1998

[54] DRY PROCESS SYSTEM

[75] Inventors: Haruhisa Kinoshita, Hirosawa Hamamatsu; Osamu Matsumoto, Akishima; Harunobu Sakuma, Hamura-machi, all of Japan

[73] Assignee: Kokusai Electric Co., Ltd., Tokyo, Japan

[21] Appl. No.: 587,822

[22] Filed: Jan. 11, 1996

Related U.S. Application Data

[63] Continuation of Ser. No. 923,149, Jul. 31, 1992, abandoned, which is a continuation of Ser. No. 603,537, Oct. 25, 1990, abandoned.

[30] Foreign Application Priority Data

Nov. 15, 1989 [JP] Japan ................. 1-298694

[51] Int. Cl.$^6$ ................. C23C 14/34; C23C 16/00; C23F 1/02
[52] U.S. Cl. ................. 204/298.37; 204/298.34; 204/298.39; 118/723 E; 156/345
[58] Field of Search ................. 156/345; 204/298.31, 204/298.34, 298.37, 298.39; 118/723 E

[56] References Cited

U.S. PATENT DOCUMENTS

| | | | |
|---|---|---|---|
| 3,325,394 | 6/1967 | Kay et al. | |
| 4,292,153 | 9/1981 | Kudo et al. | 204/164 |
| 4,422,896 | 12/1983 | Class et al. | 204/298.37 X |
| 4,601,807 | 7/1986 | Lo et al. | 204/298 |
| 4,618,477 | 10/1986 | Babu et al. | 204/298 X |
| 4,657,619 | 4/1987 | O'Donnell | 204/298.37 X |
| 4,842,707 | 6/1989 | Kinoshita | 204/298 |
| 4,871,421 | 10/1989 | Ogle et al. | 156/643 |
| 4,963,242 | 10/1990 | Sato et al. | 204/298.31 |

FOREIGN PATENT DOCUMENTS

| | | | |
|---|---|---|---|
| 36-30036 | 2/1961 | Japan . | |
| 38-155546 | 6/1963 | Japan . | |
| 0124235 | 9/1980 | Japan | 204/298.39 |
| 6337193 | 9/1983 | Japan . | |
| 62-23987 | 1/1987 | Japan . | |
| 62-97329 | 5/1987 | Japan . | |
| 0190173 | 8/1988 | Japan | 204/298.39 |
| 1522059 | 8/1978 | United Kingdom . | |

OTHER PUBLICATIONS

Noda et al., "MOS . . . system", Jap. Journal of Appl. Phys., vol. 28, No. 11, Nov. 1989, pp. 2362–2367.
Kinoshita et al., "Highly . . . magnetic", 1986 Drug Process Symposium, pp. 36–41.

*Primary Examiner*—Nam Nguyen
*Attorney, Agent, or Firm*—David O'Reilly

[57] ABSTRACT

A dry process system comprising a chamber having an inlet for reaction gas and an exhaust port for exhaust gas, at least one pair of electrodes connected with an alternating current power source through a blocking capacitor, respectively, and one or more magnetic field applying means for generating a magnetic field nearly parallel to a surface of each electrode. The distance between adjacent electrodes is set to the extent that electrons can travel nearly without collision in the space between the adjacent electrodes. Since the distance between adjacent electrodes is narrow, one plasma generated in the neighborhood of one of the adjacent electrode and the other plasma generated in the neighborhood of another electrode can commingle with each other so that the distribution of plasma is made nearly equal, thus a nearly uniform plasma can be formed without a rotating magnetic field.

17 Claims, 9 Drawing Sheets

DRY PROCESS SYSTEM

This is a continuation of application Ser. No. 07/923,149 filed on Jul. 31, 1992 abandoned which in turn, is a continuation of application Ser. No. 07/603,537 filed on 25 Oct. 1990 abandoned.

FIELD OF THE INVENTION

The present invention relates to a dry process system in which a magnetron discharge is used and which can be used for a CVD system, etching system, and a sputtering system, and particularly to a dry process system comprised of at least two pair of electrodes opposed to each other and between which a maganetron discharge is generated for dry processing.

BACKGROUND OF THE INVENTION

FIG. 1 is a schematic illustration of an example of a conventional dry process system.

A conventional dry process system comprises a chamber 1, a cathode electrode 2 provided on the bottom of chamber 1 with said electrode being insulated from chamber 1 by insulator 9. Cathode electrode 2 is connected through a blocking capacitor 7 with one terminal of high frequency power source or RF power source 6 while the other terminal of the high frequency power source and the chamber 1 grounded. A pair of solenoids 12 in three-piece sets are provided outside chamber 1 for generating magnetic field 11 in directions nearly parallel to the surface of cathode electrode 2. Substrate or wafer 3 is disposed on cathode electrode 2. Reaction gas 4 is introduced into chamber 1 while exhaust gas 5 is discharged from chamber 1. High frequency power Ph of 13.56 MHz is applied through blocking capacitor 7 to cathode electrode 2. Chamber 1 acts as an anode electrode 8. High frequency electric field 10 perpendicular to a surface of cathode electrode 2 is generated over cathode electrode 2, while a magnetic field parallel to the surface of cathode electrode 2 is generated by the solenoids.

FIG. 2 is a schematic illustration of another example of a conventional dry etching system.

The conventional dry etching system has the same construction as the former conventional system except that anode electrode 8 is opposed to cathode electrode 2 at an interval of 70 mm above cathode electrode 2 in a manner that anode electrode 8 is parallel to cathode electrode 2, and anode electrode 8 is grounded.

These conventional systems operate as follows.

After substrate 3 to be etched is disposed on cathode electrode 2, chamber 1 is sufficiently evacuated by a vacuum pump and reaction gas 4 is introduced into chamber 1 to a gas pressure of about 10 mTorr. Thereafter high frequency power Ph is supplied to cathode electrode 2 from the high frequency power through blocking capacitor 7. The reaction gas is excited into a plasma consisting of positive ions and negative electrons. By the supply of high frequency power into the cathode electrode, high frequency electric field 10 in a direction perpendicular to the surface of cathode electrode 2 is generated.

Therewith, magnetic field 11 is generated in a direction parallel to the surface of cathode electrode 2 by means of a pair of solenoids in three-piece sets. High frequency electric field 10 and magnetic field 11 intersecting each other are formed in a space above the substrate causes a spiral cycloidal motion of light electrons along an orbit of small radius and in a direction perpendicular to magnetic lines of force, said electrons violently colliding with a neutral etching gas which results in generation of a high density plasma, magnetron discharge 13 being generated thereby.

Since electrons existing in a magnetic field drift in a direction perpendicular to the magnetic field by Lorenz forces, a one-sided distribution of plasma densities is formed. To prevent this, a pair of solenoids in three-piece sets are arranged around the chamber 1. Alternating current is passed into the three-piece set of solenoids, an apparent rotating magnetic field is generated thereby by and in which distribution of plasma density is apparently equalized.

Usually, the ionization rate of reaction gas in the excitation of reaction gas due to high frequency electric discharge is small, about $10^{-4}$. However since the ionization rate in the magnetron discharge is higher than the former ionization rate by two digits, $10^{-2}$ the etching rate is therefore made larger by more than one digit due to magnetron discharge.

However in the above-mentioned systems, under a static magnetic field, uniform etching is difficult, because a one-sided distribution of plasma densities is formed. Variations of etching accuracy is high, more than ±30%. Further it is impossible to etch more than two substrates disposed on both cathode electrode 2 and anode electrode 8 at the same time, because the self-bias voltage of cathode electrode 2 is remarkably different from that of anode electrode 8.

SUMMARY OF THE INVENTION

Accordingly, it is one object of the present invention to provide a dry process system wherein a substrate can be processed very uniformly at high speed under a static magnetic field.

It is a further object of the present invention to provide a dry process system wherein plural substrates disposed on respective electrodes can be processed at the same time.

The above-mentioned objects can be achieved by a dry process system which comprises a chamber having an inlet for reaction gas and an exhaust port for exhaust gas, at least two electrodes connected with an alternating current power source through a blocking capacitor, respectively, and one or more magnetic field applying means for generating a magnetic field nearly parallel to a surface of each electrode. The distance between adjacent electrodes is set to an extent that electrons can travel nearly without collision in the space between the adjacent electrodes.

Further, the above-mentioned objects of the present invention are also achieved by a dry process system which comprises a chamber having an inlet for reaction gas and an exhaust port for exhaust gas, at least two electrodes connected with an alternating current power source through a power distributing unit, respectively, and one or more magnetic field applying means for a generating magnetic field nearly parallel to a surface of each electrode, The distance between adjacent electrodes is set to an extent that electrons can travel nearly without collision in the space between the adjacent electrodes.

Furthermore, the above-mentioned objects of the present invention are also attained by a dry process system which comprises a chamber having an inlet for reaction gas and an exhaust port for exhaust gas, said chamber being connected with the positive side of a direct current power source or grounded, at least two electrodes connected with positive side of the direct current power source, respectively, and one or more magnetic field applying means for generating a magnetic field nearly parallel to a surface of each electrode. The distance between the adjacent electrodes is set to an extent that electrons can travel nearly without collision in the space between the adjacent electrodes.

In the present invention, the distance between adjacent electrodes is 1 to 5 cm, and preferably 1 to 3 cm.

In the present invention, the internal pressure of the chamber is about 1 to 100 mTorr, and preferably 1 to 10 mTorr.

Further, in the present invention, the magnetic field is about 50 to 500 gauss.

In the present invention, when the number of said electrodes is more than three, it is preferable that the respective electrodes have areas equal to each other, respectively, and the respective distances between adjacent electrodes are equal to each other.

In the present invention, when an alternating current power source is used as a power source of the dry process system, the alternating current power source may be provided for supplying synchronously alternating current power having the same frequency to each electrode through the blocking capacitor under the appropriate phase difference.

Further, the alternating current power source can be provided for supplying synchronously alternating current power having the same frequency to each electrode through the blocking capacitor nearly under the same phase, wherein the chamber is grounded. In this case, the first electrode and the second electrode may be electrically connected with each other.

In the present invention, a set of a first alternating current power source and a second alternating current power source can be used as alternating current power source for the dry process system, wherein said first alternating current power source is connected with the second alternating current power source through a phase shifter.

In the present invention, the phase difference is in the region of 0°±40° or 180°±40°.

In the present invention, when gas for film forming such as $SiH_4$ is used, the dry process system according to the present invention can be used as a CVD (chemical vapor deposition) system. When etching gas such as $CF_4$ is used, this system can be used as an etching system. Further when sputtering gas such as Ar is used, this system can be used as a sputtering system.

According to the present invention, a magnetron discharge is generated, because the electric field and the magnetic field intersect each other. This magnetron discharge generates plasma. Some of light electrons existing in the plasma run into each electrode; these electrons are stored in the blocking capacitor, thereby negative self-bias direct current is formed.

With the formation of a self-bias voltage, an ion sheath having high positive ion concentration is formed in the neighborhood of each electrode. However, the electric resistance of the ion sheath becomes high due to very low mobility of positive ions, thereby a strong electric field is applied in a direction perpendicular to each electrode. The electric field corresponding to self-bias voltage formed in the ion sheath of each electrode runs against each electrode. Namely, the lines of the electric field corresponding to the self-bias voltage formed in the ion sheath of the first electrode is opposite in direction to the lines of the electric field corresponding to self-bias voltage formed in the ion sheath of the second electrode opposed to the first electrode. Because the magnetic fields are in the same direction and one electric field corresponding to the first electrodes and the other electric field corresponding to the second electrodes are in the opposite direction to each other, the direction of Lorenz force acting on the secondary electrons emitted from each electrode becomes opposite to each other.

When the distance between adjacent electrodes is set to an extent that electrons that is a mean free path of the electrons can travel nearly without collision in the space between adjacent electrons, one plasma generated in the neighborhood of one electrode and the other plasma generated in the neighborhood of the other electrode can commingle with each making the distribution of plasma nearly everywhere. Accordingly nearly uniform plasma can be formed, without a rotating magnetic field. The mean free path is a mean distance in which electrons can freely move in gas molecules until the electrons collide with a gas molecule.

Further, when the distance between adjacent electrodes is so small that the distance substantially corresponds to a diameter of rotational movement of electrons about a magnetic line of force (i.e., twice Larmor's radius), because the ion sheath is formed on the surface of each electrode, electrons rotating about magnetic lines of force, when they run into the ion sheath, are repulsed by the strong electric field of the ion sheath so that they are repulsed in the opposite direction. Accordingly, there is a high probability that the rotating electrons keep rotating until they collide with gas molecules. When the pressure of reaction gas corresponds to a pressure under which a circumference of the rotational movement of the electron is substantially equal to the mean free path of electrons the electrons freely rotate by about one rotation before they collide with gas molecules. Gas pressure is inversely proportional to the mean free path of electrons. Therefore, to make electrons rotate more than one rotation, it is necessary to limit the gas pressure below the pressure under which a circumference of the rotational movement of the electron is substantially equal to the mean free path of electron.

Namely, when the distance between adjacent electrodes and pressure of reaction gas is selected so that the distance between the adjacent electrons is equal to or less than the mean free path of electrons, the electrons can rotate without drifting; electrons can drift nearly right and left in the space between adjacent electrodes before electrons collide with gas molecules in the space so that a plasma consisting of ions or radicals is generated. In other words, when the distance between adjacent electrodes is narrow, multiple electrons effectively run into the space between adjacent electrodes and effectively collide with gas molecules. Therefore a plasma having higher density than the usual magnetron plasma is generated. Further because the drift of electrons in the right and left directions is low, plasma having good uniformity is generated.

Since the ionization rate of plasma caused by a magnetron discharge is higher by two digits or more than that of plasma caused by an alternating discharge, dry etching according to the present invention can be performed at a higher rate of more than one digit as compared with a conventional system.

BRIEF DESCRIPTION OF THE DRAWINGS

In the drawings:

FIG. 12($b$) is a schematic representation of an electron transport process model in a magnetron plasma generated between opposed electrodes at a narrow distance;

DETAILED DESCRIPTION OF THE INVENTION

The present invention is now explained by an example with reference to the drawings.

Figure 1:
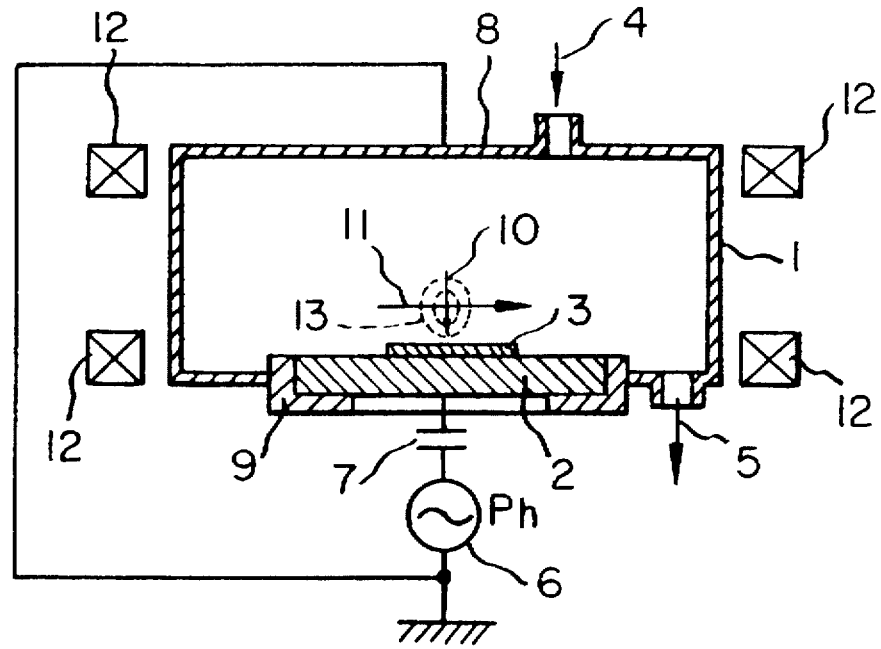
FIG. 1 is a schematic illustration of an example of a conventional dry etching system belonging to the category of a dry process system.
Figure 2:
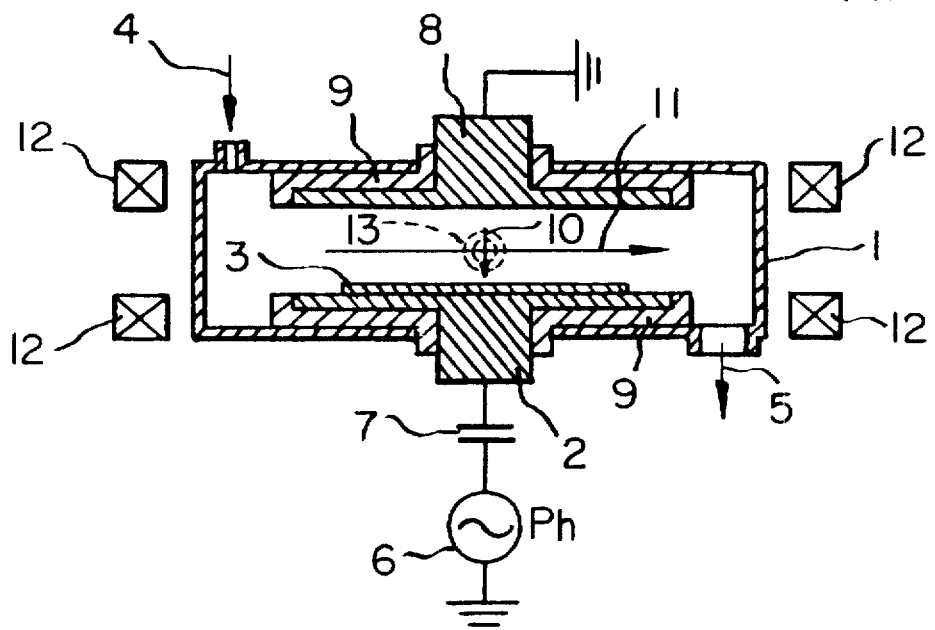
FIG. 2 is a schematic illustration of another example of a conventional dry etching system belonging to the category of a dry process system.
Figure 3:
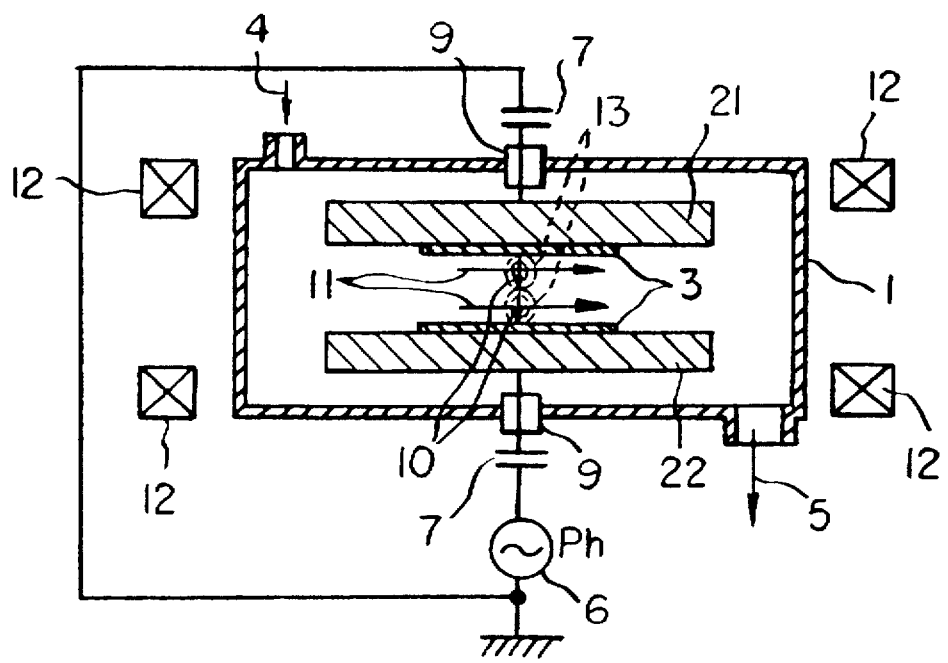
FIG. 3 is a schematic illustration of a first embodiment of a dry process system according to the present invention.

FIG. 3 is a schematic illustration of a first embodiment of a dry process system according to the present invention, in which the same reference characters in FIGS. 1 and 2, showing conventional systems, designate like or corresponding parts as in the conventional systems of FIGS. 1 and 2.

The first embodiment of the present invention comprises first electrode 21 and second electrode 22 arranged parallel to each other in chamber 1. First electrode 21 is connected with one terminal of an AC, high frequency or RF power source 6 through blocking capacitor 7 and second electrode 22 connected with the other terminal of high frequency power source 6 through blocking capacitor 7. A wire connecting first electrode 21 with one terminal of high frequency power source 6 through blocking capacitor 7 and a wire connecting second electrode 22 with the other terminal of high frequency power source 6 through the blocking capacitor 7 are insulated from chamber 1 by insulator 9, 9, respectively. A pair of three-piece sets of solenoids 12 are arranged outside chamber 1 surrounding the first and the second electrodes 21, 22 in an orientation such that magnetic field lines 11 are parallel to first and second electrodes 21, 22.

In the first embodiment, chamber 1 is grounded and the average voltage of the two terminals of high frequency power source 6 are set to be 0V to stabilize a plasma discharge. However, it is not always necessary to ground chamber. One terminal of the high power source may be grounded when chamber 1 is not grounded. When one terminal of high frequency power source 6 is grounded, chamber 1 is preferably in an electrically drifting state.

Further in the first embodiment, the dry process system is provided with one high frequency power source. However a two-unit set of high frequency power sources may be used with frequencies that are synchronized at a phase difference of 180°; that is with opposite phases to each other so that the high frequency power sources are controlled to supply the same output power. When such a two-unit set of high frequency power sources are used, like operation and effect can be also obtained by supplying high frequency power to respective electrodes 21, 22 from the respective high frequency power sources through respective blocking capacitors 7, 7. In this case, it is possible to change a first electric energy supplied to the first electrode and another electric energy which is supplied to the second electrode and change the phase difference between power supplied to the first electrode and power supplied to the second electrode. Therefore it is possible to optimize distribution of plasma generated between both electrodes 21, 22 by suitably adjusting the ratio of electric energy supplied to the first electrode to electric energy supplied to the second electrode and the phase difference between power supplied to the first electrode and power supplied to the second electrode.

Further solenoid 12 for applying a magnetic field can be replaced by other means for applying a magnetic field, for example combined rod-shaped permanent magnets. Any means for applying magnetic field 11 parallel to substrates 3 on electrodes 21, 22 over the substrates can be used. Even under a static magnetic field, enough uniformity of plasma densities can be obtained. However if the magnets are rotated, plasma densities further level off so that the uniformity of plasma densities is improved.

Substrates 3 are disposed on electrodes 21, 22, respectively. However, it is not always necessary to arrange substrates 3 on both electrodes 21, 22, but it is necessary to dispose either electrode 21 or electrode 22. Since it is desirable that first electrode 21 and second electrode 22 are symmetric with respect to each other, as much as possible, both the electrodes should be parallel to each other and the ratio of area of first electrode 21 to that of second electrode 22 should be as close to 1:1 as possible. In this case, blocking capacitor 7 for first electrode 21 and blocking capacitor 7 for second electrode 22 preferably have the same capacity, as much as possible.

In the first embodiment, substrates 3 are disposed on first electrode 21 and second electrode 22. Chamber 1 is sufficiently exhausted of air by means of a vacuum pump, and a reaction gas 4 introduced into chamber 1 to such an extent that the internal pressure of chamber 1 reaches about 1 to 100 mTorr or less. Thus the internal pressure of the chamber is adjusted. Electric current is applied through solenoids 12, thereby magnetic field 11 of about 50 to 500 gauss is applied in the space between both electrodes 21, 22 over substrates 3 so that magnetic field lines 11 run nearly parallel with each electrode 21, 22. Power Ph of high frequency power source 6 is supplied through blocking capacitors 7, 7 to first electrode 21 and second electrode 22 in opposite phase to each other. Electric field 10 is generated over substrates 3 by applied power Ph. Because electric field 10 and magnetic field 11 intersect at right angles, magnetron discharge 13 (shown by a broken line) is generated. Plasma is generated by magnetron discharge 13, so that a part of the light electrons in the plasma run into first electrode 21 and second electrode 22, and stored in blocking capacitors 7 so that a self-bias voltage is generated.

Ion sheaths in which a positive ion density is higher, in the neighborhood of first electrode 21 and second electrode 22, are generated with the generation of the self-bias voltage of negative direct current. The direction of the electric field lines 10 corresponding to self-bias voltage generated in the ion sheaths of first electrode 21 and second electrode 22 turn upward and downward, respectively. Because the direction of magnetic field lines 11 are the same, and the direction of electric field lines 10 are opposite to each other, the direction of Lorenz forces acting on secondary electrons emitted from each electrode 21, 22 are opposite to each other. Namely, in the neighborhood of first electrode 21, the plasma density is higher in a region corresponding to the rear side of the paper on which the figures are drawn (namely the opposite side thereof). However it is lower in a region corresponding to the front side of the paper on which the figures are drawn (near side). On the other hand, in the neighborhood of second electrode 22, the plasma density is lower in a region corresponding to the rear side of the paper on which the figures are drawn (namely the opposite side thereof), however it is higher at a region corresponding to the front side of the paper on which the figures are drawn (near side).

When the distance between both electrode 21, 22 is short enough so that the space between both electrodes 21, 22 is set to such an extent that electrons can travel, nearly without collision, one plasma generated in the neighborhood of first electrode 21 and the other plasma generated in the neighborhood of second electrodes 22 mingle with each other, without being separated from each other, so that the distribution of plasma densities is nearly uniform. Accordingly, plasma can be generated to be nearly uniform without rotating the magnetic field. Of course the uniformity of plasma can be further improved if the magnetic field is rotated. The distance between both electrodes 21, 22 is preferably about 1 cm to 5 cm.

The ionization rate of plasma caused by the magnetron discharge is higher by more than two digits as compared with the ionization rate of plasma caused by the usual high frequency discharge. Therefore dry etching can be performed by the first embodiment system at a higher rate of more than one digit as compared with the conventional system.

Figure 4:
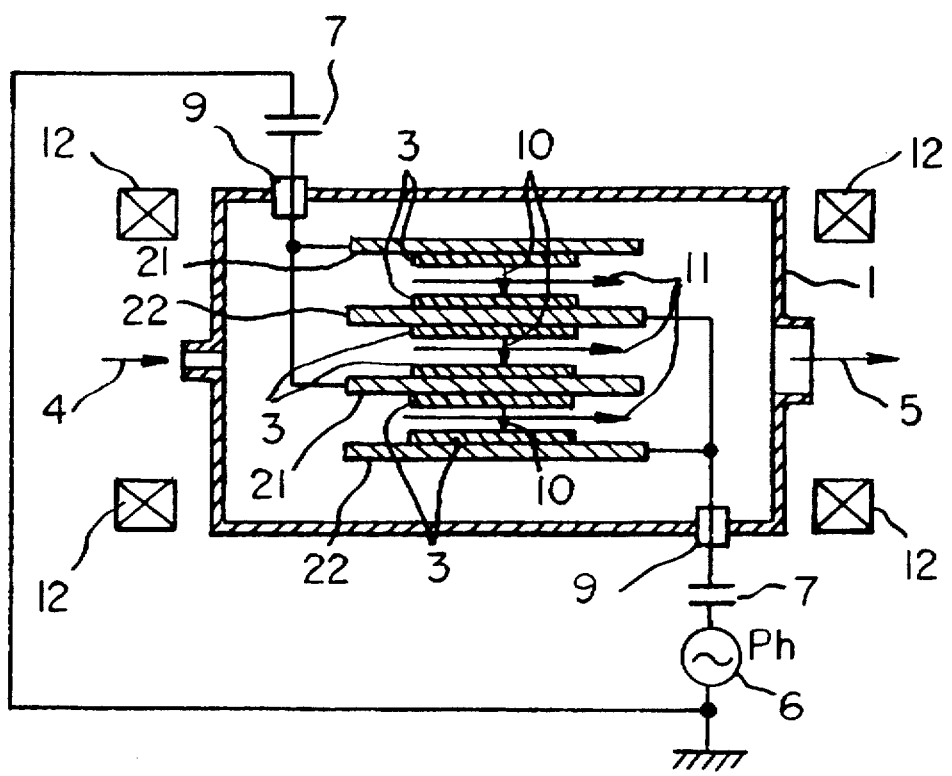
FIG. 4 is a schematic illustration of a second embodiment of a dry process system according to the present invention.

FIG. 4 is a schematic illustration of a second embodiment of the present invention, in which the same reference characters as in FIG. 3 designate like or corresponding parts of the first embodiment.

The second embodiment is substantially the same construction as the first embodiment except that the second embodiment comprises two first electrodes 21 and two second electrodes 22 which are arranged alternately and parallel to each other in chamber 1. First electrodes 21 and second electrodes 22 are connected with AC or high frequency power source 6 through blocking capacitors 7, 7, respectively. With a view to equalizing the state of plasmas generated between adjacent electrodes 21, 22, it is preferable that the distances between adjacent electrodes be of the same value, and areas of the respective electrodes are almost equal to each other so that the capacitance of blocking capacitor 7 for the first electrodes and the capacitance of blocking capacitor 7 for the second electrodes are almost equal to each other.

The use, procedure of operation, and state of operation are almost the same as the dry process system of in FIG. 3. This system enables six substrates 3 to be processed at the same time. Further it is possible to process substrates 3 of more than 12 pieces at the same time, by using this dry process system and disposing substrates 3 of more than 2 pieces on each electrode 21, 22. Further the total number of electrodes 21 and the total number of electrodes 22 may be more than 3 or 5, respectively, wherein it is necessary that first electrodes 21 and second electrodes 22 should be arranged alternately. First electrodes 21 and second electrode 22 are preferably parallel to each other. However electrodes 21, 22 are not always flat in shape, but may be curved in shape. A method for supplying high frequency power Ph to each electrode 21, 22 is the same as that of the first embodiment. According to the supplying method, chamber 1 is either grounded or in a state of drift.

Figure 5:
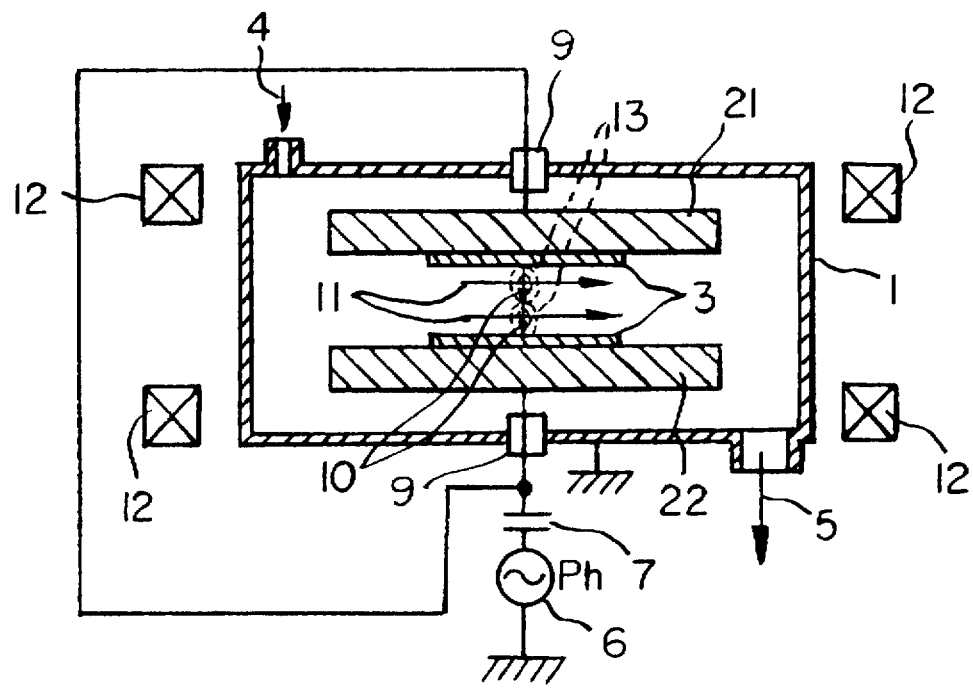
FIG. 5 is a schematic illustration of a third embodiment of a dry process system according to the present invention.

FIG. 5 is a schematic illustration of a third embodiment of a dry process system according to the present invention, in which the same reference characters as in FIGS. 3 and 4 designate the same or corresponding parts of the system of FIGS. 3 and 4.

The third embodiment comprises first electrode 21 and second electrode 22 electrically connected with each other so that both the electrodes become equipotential. High frequency electric power Ph is synchronously supplied with equiphase to respective electrodes 21, 22 from high frequency power source 6 through blocking capacitor 7. Chamber 1 is grounded. High frequency power source 6 can be replaced by a two-unit set of high frequency power sources synchronized with equiphase and controlled to have the same power; thereby a similar operation and effect of using one high frequency power source is obtained. In this case, electric energy of power supplied to the first and second electrodes from a two-unit set of high frequency power sources through the blocking capacitor can be controlled different from each other. Therefore distribution of a plasma generated between electrodes 21, 22 can be optimized by suitably adjusting the ratio of electric energy of power supplied to the first electrode to electric energy of power supplied to the second electrode. Further when one terminal of a respective frequency power source is grounded, the chamber is preferably grounded. Magnetic field 11 is applied parallel to each electrode 21, 22 by means of solenoid 12 as in the first and second embodiment. To improve plasma uniformity and generate plasma of high density, it is preferable to make the distance between first electrode 21 and second electrode 22 somewhat small, about 1 cm to 5 cm. Such a distance becomes equal to the mean free path that electrons can travel almost without collision in the space between first electrode 21 and second electrode 22. First electrode 21 and second electrode 22 can also be electrically connected with each other through a conductive wire or conductive plate inside chamber 1 so that the same effect is achieved as in the case where the first and second electrodes are electrically connected with each other outside the chamber.

In the first and second embodiments, high frequency power source 6 is used as power source. However, in the present embodiment, high frequency power source 6 can be replaced by a direct power source. When a direct current power source is used as power source, blocking capacitor 7 is unnecessary. A negative voltage is directly applied to each electrode 21, 22, while a positive voltage is directly applied to chamber 1 or other electrode arranged inside the chamber. Substrate 3 or plural substrates 3 can be disposed on both electrodes 21, 22 or either electrode 21 or 22.

The conditions for generating a plasma are almost the same as the conditions given in the first and second embodiments.

In the third embodiment, only first and second electrodes 21, 22 are used as electrodes. However electrodes of more than 3 pieces may be used in the same manner as in the second embodiment, wherein it is preferable that respective electrodes 21, 22 are electrically connected with each other so as to become equipotential, the areas of the respective electrodes are almost the same, the respective distances between adjacent electrodes are almost the same each other, and the respective electrodes are parallel with each other. In this case, substrates of more than 4 pieces can be disposed on opposed surfaces of adjacent electrodes.

Figure 6:
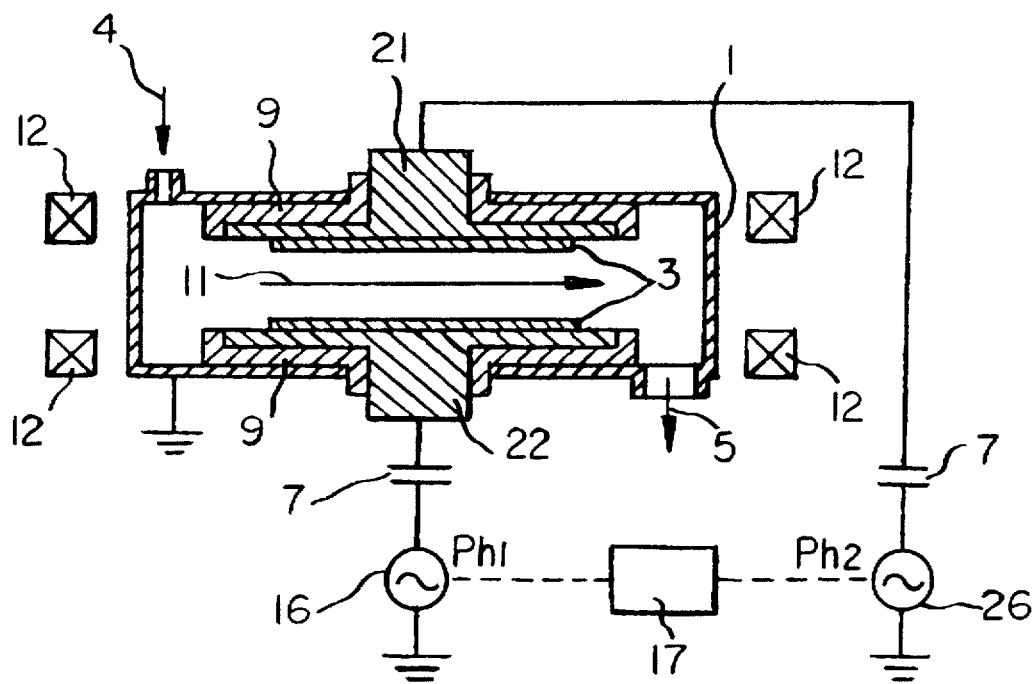
FIG. 6 is a schematic illustration of a fourth embodiment of a dry process system according to the present invention.

FIG. 6 is a schematic illustration of a fourth embodiment of a dry process system according to the present invention, in which the same reference characters as in FIGS. 2, 3, 4 and 5 showing a conventional system designate the same parts that correspond to parts of conventional systems, and in the fourth embodiment, there are a first electrode and a second electrode designated by reference numerals 21 and 22.

In the fourth embodiment, a high frequency power source for supplying independently high frequency electric powers Ph2, Ph1, is provided by high frequency electric powers source 26, 16. The pair of high frequency power sources 26, 16 are controlled to oscillate with the same frequency at an optional phase difference by means of phase shifter 17. High frequency electric powers Ph1, Ph2 can be independently controllable.

Further solenoid 12 can be replaced by other means for applying a magnetic field between adjacent electrodes, for example a rod-shaped permanent magnetic combined into one. Any means for applying magnetic field 11 nearly parallel to substrates 3 on electrodes 21, 22 can be used. Even under a static magnetic field, enough uniformity of plasma densities can be obtained. However if the magnetic field is rotated, p plasma densities further level off so that the uniformity of plasma densities is improved.

In the fourth embodiment, substrates 3 are disposed on electrodes 21, 22, respectively. Chamber 1 is sufficiently evacuated, and thereafter reaction gas 4 is introduced into chamber 1 to an extent that the internal pressure of the chamber reaches about 1 to 100 m Torr or less. Electric current is sent through solenoid 12, thereby magnetic field 11 of about 50 to 500 gauss is applied to the space between adjacent electrodes 21, 22 so that the magnetic field lines run nearly parallel with each electrode 21, 22.

Electric power Ph1, Ph2 of high frequency power sources 16, 26 are supplied to respective electrodes 21, 22 at an arbitrary phase difference and an arbitrary power supply ratio through blocking capacitor 7, and an electric field is generated over substrates 3 by applied power Ph1, Ph2. The direction of the electric field changes according to the phase difference and power supply ratio of power Ph1, Ph2. Because electric field 10 and magnetic field 11 intersect at right angles, a magnetron discharge is generated. Plasma is generated by the magnetron discharge, so that a part of the light electrons in the plasma run into first electrode 21 and into second electrode 22, which is stored in blocking capacitors 7 so that a negative self-bias voltage is generated. Ion sheaths in which positive ion densities are higher are generated in the neighborhood of first electrode 21 and second electrode 22 with the generation of the negative self-bias voltage. In the ion sheath section, there are positive ions having high densities. However, since the mobility of positive ion is remarkably low, electric resistance of the ion sheath section increases so that strong electric fields are applied in a direction perpendicular to the respective electrodes 21, 22. The directions of the electric fields corresponding to the self-bias voltage generated in the ion sheath sections of first and second electrodes 21, 22 point toward respective electrodes 21, 22, namely turn upward and downward, respectively, in opposite direction to each other. Positive ions are accelerated by the electric fields, accelerated positive ions collide with first and second electrodes 24, 22 while secondary electrons are emitted.

In the above embodiments, when the distance between adjacent electrodes 21, 22 is changed, the following differences occur between a case where the distance between adjacent electrodes is wider and a case where the distance between both the electrodes is narrow.

Figure 12A:
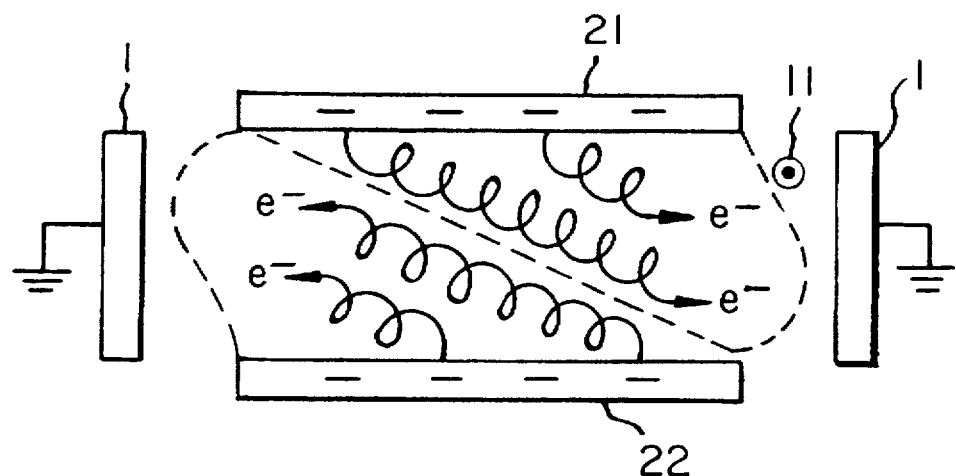
FIG. 12($a$) is a schematic representation of an electron transport process model in plasma generated between opposed electrodes at a wide distance.

FIG. 12(a) shows the motions of electrons in a plasma when the distance between first and second electrodes 21, 22 is wider, for example about 60 mm to 100 mm. Because the distance between adjacent electrodes is wide enough, secondary electrons emitted from respective electrodes 21, 22 drift right and left by the action of the electric field and the magnetic field which intersect at right angles. Such a motion is referred to as a cycloid motion. Because the secondary electrons emitted from first electrode 21 drift right secondary electrons emitted from second electrode 22 drift left.

Therefore, if the distance between the first and second electrodes 21, 22 is wider than the extent the electrons can travel nearly without collision in the space between the electrodes 21, 22, the secondary electrons emitted from the first electrode 21 and the secondary electrons emitted from the second electrode 22 are separated from each other, and the plasmas are separately produced in the neighborhood of the first electrodes 21 and in the neighborhood of the second electrodes 22. However, if the distance between the first and second electrodes 21, 22 is substantially equal to the extent the electrons can travel nearly without collision in the space between the electrodes 21, 22, that is the mean free path of the electrons, the plasmas generated in the neighborhood of the electrodes commingle with each other so that distribution of the commingles plasma is equal at anywhere. The mean free path of the electrons is the average distance that the electrons can travel in the gas molecules until they collide with the gas molecules, and according to "Plasma Etching in Semiconductor Fabrication" Russ A. Morgan 1985, ELSEVIER, the mean free path of the electrons λe is expressed as follows, $$\lambda_g = \frac{h}{1/2 \rho u}$$

where $$u = \sqrt{\frac{8 \, kT}{\pi m}}$$

$\lambda_e \sim \lambda_g \times 5.6$ ($\lambda_g$ – mean free path of gas)

h=viscosity
ρ=density
u=velocity
m=mass of molecule of gas

Figure 12B:
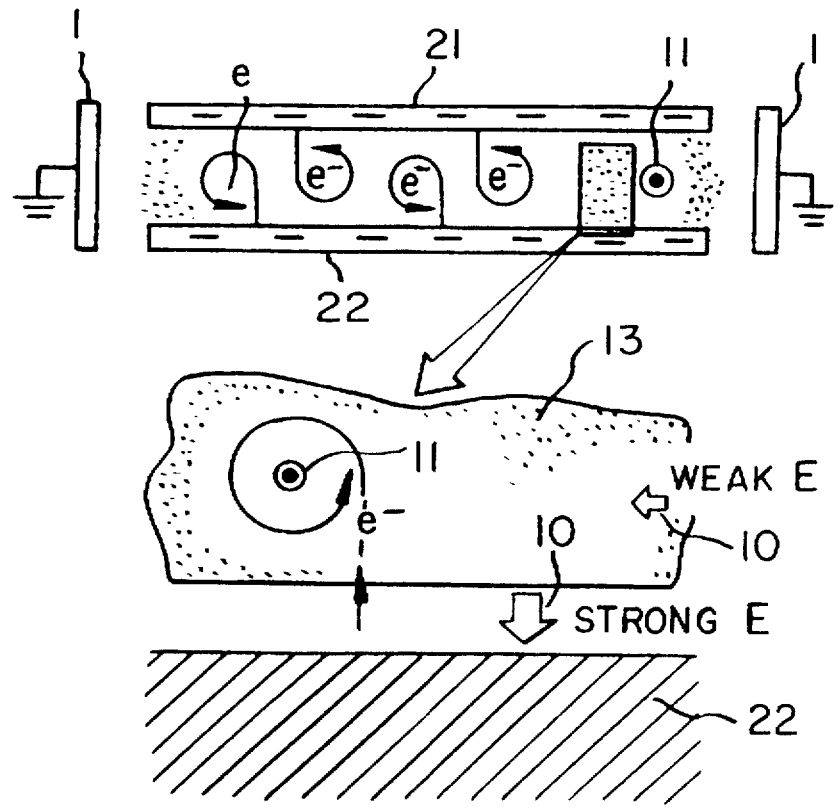

Further, FIG. 12(b) shows motions of electrons in the plasma when the distance between the first and second electrodes 21, 22 is substantially equal to twice the Larmor's radius (the diameter) of the electrons. Namely, the distance is about 10 nm to 30 nm. Now, supposing that magnetic flux density of the magnetic filed and self-bias voltage are 150 gauss and 200V, respectively, the radius of gyration of the electrons, that is Larmor's radius is about 4 mm. Therefore, the diameter of the rotation of the secondary electrons about the magnetic lines force is about 8 mm. The secondary electrons rotating about the magnetic lines of force with diameter about 8 mm are likely to approach the opposite electrodes. Because an ion sheath is formed on the surface of electrode, electrons are repulsed by the strong negative electric field, and returned in the opposite direction. Therefore, when the distance between adjacent electrodes is narrow, the electrons are likely to continue rotating without largely drifting right and left until the rotating electrons collide with the gas molecules.

The circumference of a circle of about 8 mm diameter is about 25 mm. The gas pressure under which the length of the mean free path extends to 25 mm is about 10 mTorr, although it somewhat differs depending on the type of gas. Accordingly in a gas having a pressure of 10 mTorr, electrons freely rotate covering about one rotation under the above-mentioned plasma generation conditions so that electrons collide with gas molecules. Since the length of the mean free path of an electron is inversely proportional to the gas pressure, it is necessary to keep the gas pressure under about 10 mTorr in a way that enables an electron to rotate over one rotation. Namely, in the case when the distance between adjacent electrodes is about 10 to 30 mm, and gas pressure is under about 10 mTorr, electrons continue rotating in the space between adjacent electrodes 21, 22 nearly without drifting right and left, and collide with gas molecules so that a plasma consisting of ions or radicals is generated.

Namely because drifting of electrons in the right and left directions in FIG. 12(b) is small, electrons emitted from respective electrodes 21, 22 continue rotating about magnetic lines of force in the space between adjacent electrodes 21, 22, and effectively collide with gas molecules so that a plasma having between uniformity is generated.

Consequently, as shown in FIGS. 12(a) and (b), if the distance between the electrodes 21, 22 is substantially equal to or less than the mean free path of electrons, the uniformity of the plasma between the electrodes 21, 22 is improved without rotating magnetic field, of course it is more improved by rotating magnetic field. In addition, the density of the plasma is also increased so that the efficiency in the etching process or the CVD process is improved.

Figure 13:
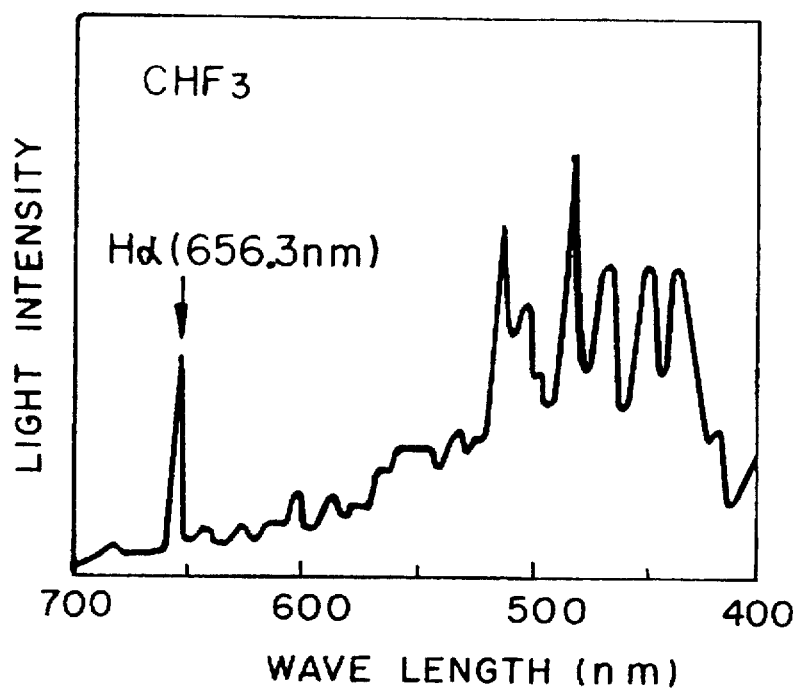
FIG. 13 is a graphical representation of the emission spectrum of $CHF_3$ magnetron plasma.

FIG. 13 shows the emission spectrum of a $CHF_3$ gas at a pressure of 1 Pa obtained by means of the system according to the fourth embodiment, wherein a bright-line spectrum of wave length 656.3 nm is in the α-ray spectrum (Hα). The intensity of Hα-rays shows a light intensity of the hydrogen atom generated by decomposition of $CHF_3$, and the extent of decomposion of $CHF_3$, that is the plasma density. Fortunately, as light noise in the neighborhood of Hα-rays is small, the comparison of plasma densities can be achieved by a comparison of Hα-ray intensities.

Figure 14:
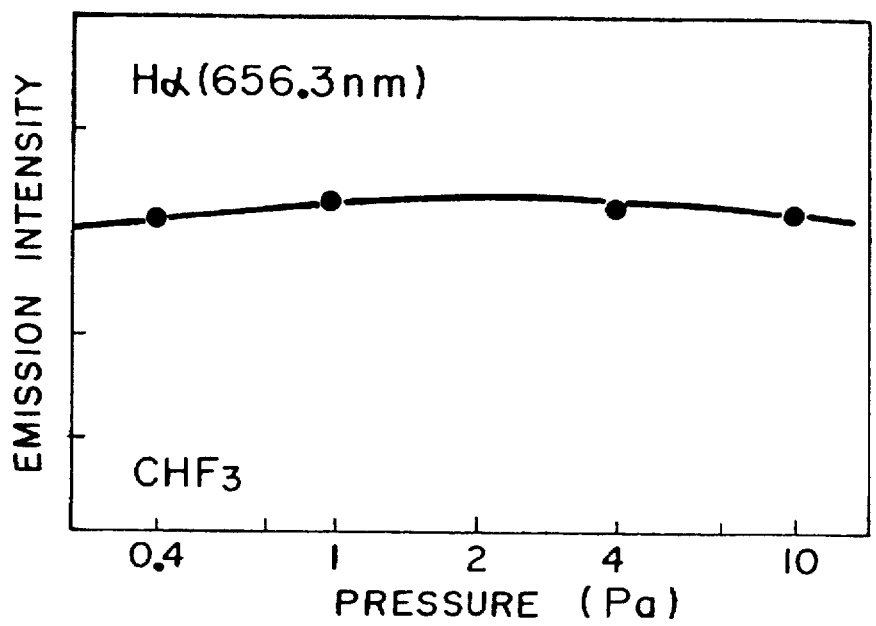
FIG. 14 is a graphical representation of the gas pressure dependence of $H\alpha$ emission intensity.

FIG. 14 shows the gas pressure dependence of a Hα-emission intensity when $CHF_3$ gas is introduced into the system according to the fourth embodiment, and the gas pressures are changed from 0.4 to 10 Pa. As shown in FIG. 14, even if the gas pressure is lowered from 10 Pa to 0.4 Pa, Hα emission intensity is almost unchanged. Although such lowering of gas pressure from 10 Pa to 0.4 Pa corresponds to weakening the inside of the chamber by 40 times in terms of gas molecule density, densities of emitting plasma are unchanged. Namely, efficiencies of plasma generation are increased as gas pressure is lowered under about 1 Pa.

There are following the relations of phase difference between power Ph2 and power Ph1 and uniformities of the plasma. At phase differences within the range of °±40° from 10°, plasma uniformities are fairly good to the extent that plasma can be visually observed to be nearly uniform. In such plasma conditions and under a static magnetic field 11, good etching uniformity of about ±15° can be obtained. In contrast with said plasma conditions and under rotating magnetic field 11, fairly good etching uniformities of about ±3% can be obtained.

When phase differences are set within the range of about 180°±40°, plasma uniformity is somewhat lowered as compared with the plasma uniformities at phase differences in the range of about 180°±40° to the extent that a plasma having somewhat strong light emissions is visible at both ends of the space between the first and second electrodes 21, 22, having both ends aligned with the directions perpendicular to magnetic lines of force 11. Substrates 3 in the neighborhood of the plasma having strong light emission are etched at a somewhat higher etching rate as compared with the etching rate of the other region of the substrates. So etching uniformities over the whole region of the substrates are worse than the case at phase differences in the range of 0°±40°. In such conditions and under a static magnetic field 11, etching uniformities of about ±30% can be obtained. In the same plasma conditions and under rotating magnetic field 11, fairly good etching uniformities of about ±3% can be obtained. In the range of a phase difference, except the above-mentioned ranges of phase difference, intermediate uniformities which lie in the region between the uniformities obtained at phase differences which lie in the neighborhood of 0° and the uniformities obtained at a phase difference which lies in the neighborhood of 180°.

There is not a very close relation between plasma density and phase difference. In any phase difference, stronger plasma than the usual magnetron plasma is generated. Accordingly in any phase, the substrates can be etched at a higher rate than in the usaual magnetron plasma. When an insulate dielectric plate is inserted between first electrode 21 or second electrode 22 and substrate 3 disposed on first electrode 21 or second electrode 22, there is a case when the phase difference between high frequency power at first electrode 21 or second electrode 22 and high frequency power at substrates 3 is generated. In this case, it is preferable that the phase difference between high frequency powers Ph1 and Ph2 is defined and considered as a phase difference between high frequency power Ph1 applied on substrate 3 and high frequency power Ph2 applied on substrate 3.

Plasma uniformities are delicately influenced by the high frequency power supply ratio of the power Ph2 supplied to first electrode 21 to power Ph1 supplied to second electrode 22. When power supplied to either electrode 21 or 22 or power supplied to both electrodes 21 and 22 is high enough, strong plasma is generated. In this case, when either electrode is grounded or when power is not supplied to either electrode, extremely non-uniform plasma is generated and plasma densities are fairly decreased. For example, when power Ph2 supplied to first electrode 21 is sufficiently high while power Ph1 supplied to the second electrode 22 is somewhat lower, a high density plasma is generated in the space between first and second electrodes 21 and 22. A self-bias voltage at first electrode 21 becomes high, the ion sheath becomes thicker and the kinetic energy of a positive ion incident on substrate 3 becomes high. In contrast a self-bias voltage of second electrode 22 becomes lower, the ion sheath becomes thinner and the kinetic energy of a positive ion incident on substrate 3 becomes lower. Therefore such a system is suitably used for etching substrates 3 or sputtering at a high rate with high ion energy, while second electrode 22 can be used suitably for etching or plasma processing and as CVD with small amount of ion energy, at a somewhat high rate and with small loss of ions by collision.

When power Ph2 supplied to first electrode 21 and power Ph1 supplied to second electrode 22 are equalized, the system can be suitably used for performing etching or plasma processing such as a CVD the substrates 3 on first and second electrodes 21 and 22 or plasma processing such as a CVD under the almost the same conditions. Therefore when the ratio of the power supplied to either of first electrode 21 or second electrode 22 to total power supplied to first and second electrodes 21 and 22 is about 20 to 80% , a strong higher density plasma can be generated as compared with the usual magnetron plasma.

When the distance between adjacent electrodes 21 and 22 is sufficiently narrow to be substantially equal to the mean free path that electrons can move in the space between first and second electrodes 21 and 22 and turning about magnetic lines of force almost without collision, electrons emitted from first and second electrodes 21 and 22 can continue rotating with being moderately mixed in the space between first and second electrodes 21 and 22. Therefore a plasma having higher density than that of the usual magnetron plasma is generated to be almost uniform. Accordingly almost an uniform plasma can be obtained under a static magnetic field. Of course, if magnetic field is rotated, plasma uniformity is further improved.

Ionization rate of a plasma caused by a magnetron discharge is more than two digits higher as compared with the ionization rate of a plasma caused by the usual high frequency discharge. Therefore dry etching can be performed by the fourth embodiment system at a rate more than one digit higher as compared with the conventional system.

In the systems, according to the first through the ninth embodiments when gas for film forming such as $SiH_4$ is used, these system can be used as a CVD system. When an etching gas such as $CF_4$ is used, these systems can be used as an etching system. Further when a sputtering gas such as Ar is used, this system can be used as a sputtering system.

Figure 7:
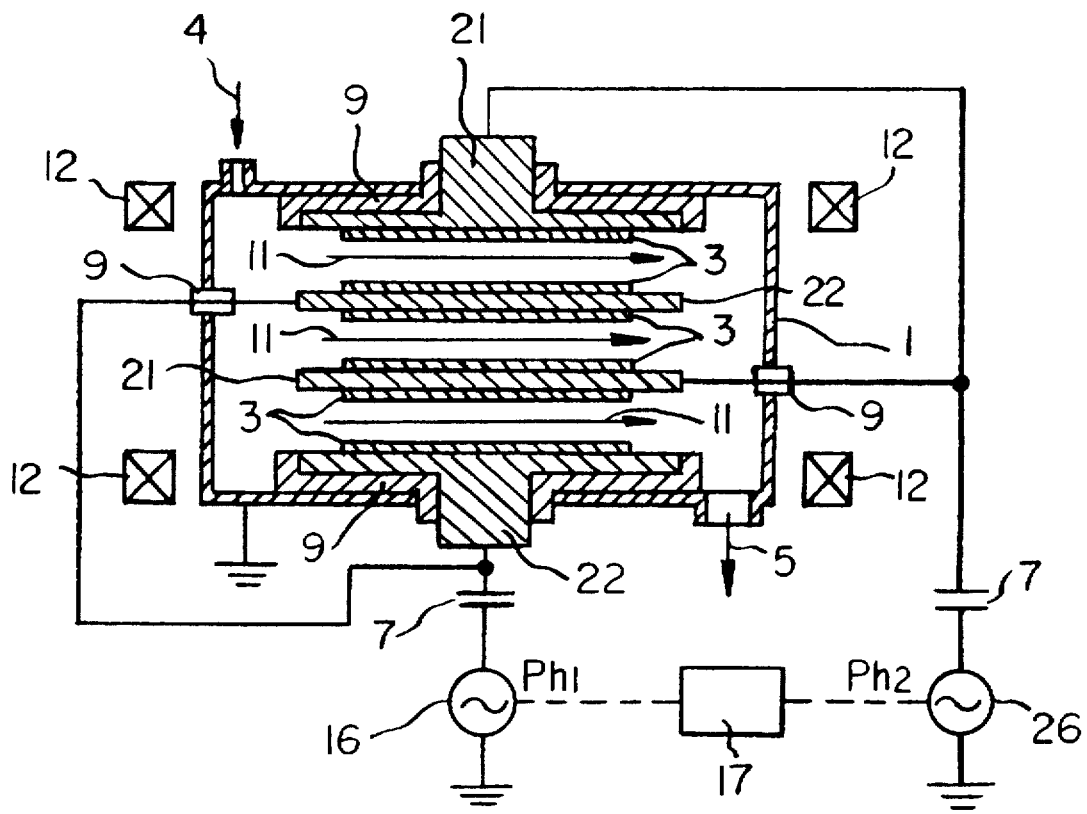
FIG. 7 is a schematic illustration of a fifth embodiment of a dry process system according to the present invention.

FIG. 7 is a schematic illustration of a fifth embodiment of the present invention, in which the same reference characters of FIG. 6 designate the same parts or corresponding parts of the system shown in FIG. 6.

The fifth embodiment comprises two first electrodes 21 and two second electrodes 22 which are arranged alternately and parallel to each other in chamber 1. First electrodes 21 are connected with the one terminal of a second AC or high frequency power source 26 while the second electrodes 22 are connected with one terminal of first AC or high frequency power source 16. First high frequency power source 16 and second high frequency power source 26 are connected through phase shifter 17 with each other. The other terminals of the respective power sources are grounded. To equalize conditions of the plasma generated in each space between the adjacent electrodes, it is preferable that the respective distances between adjacent electrodes be equal to each other, the areas of respective electrodes 21, 22 are almost equal to each other, and that the capacities of blocking capacitors 7, 7 for the first electrodes and the second electrodes are almost equal to each other.

The use, procedure of operation, and state of operation are almost the same as the dry process system shown in FIG. 6. This system enables six substrates 3 to be processed at the same time. Further it is possible to process substrates 3 of more than 12 pieces at the same time, by using this dry process system and disposing substrates 3 more than 2 pieces on each electrode 21, 22. Further the total number of electrodes 21 and the total number of electrodes 22 may be more than 3 or 5, respectively, wherein first electrodes 21 and second electrodes 22 should be arranged alternately. The first electrodes 21 and the second electrodes 22 are preferably parallel to each other. However each electrode 21, 22 is not always flat in shape, but may be curved in shape. The method for supplying electric high frequency power Ph1 and Ph2 to each electrode 21, 22 is the same as that of the fourth embodiment.

Figure 8:
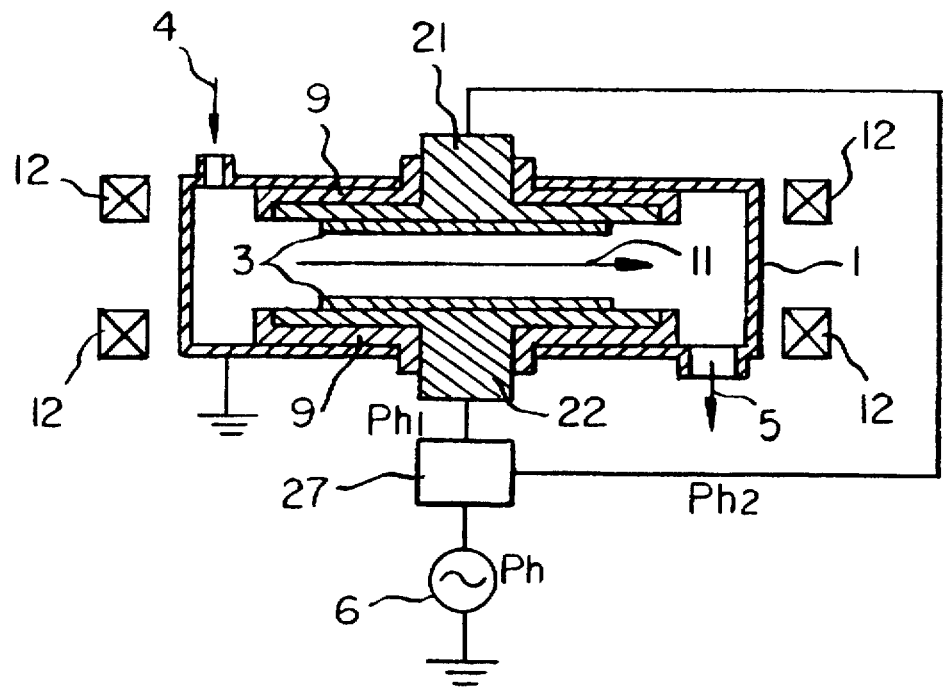
FIG. 8 is a schematic illustration of a sixth embodiment of a dry process system according to the present invention.

FIG. 8 is a schematic illustration of a sixth embodiment of a dry process system according to the present invention, in which the same reference characters as in FIGS. 6, 7 designate the same or corresponding parts as those shown in FIGS. 6 and 7.

The sixth embodiment comprises first electrode 21 and second electrode 22 which are connected through power distributer 27 with a high frequency power source 6 and to which power Ph generated in high frequency power source 6 is supplied through power distributer 27. Power distributer 27 has a transformer for distribution of power of the one-input-to-two-output type, a phase control unit including a coil and a variable condenser, and a matching box for matching impedance of the first electrode to impedance of the second electrode. The matching box incorporates a blocking capacitor at the output units thereof. There are some combinations of the number of transformers for distribution of power, phase control units and the matching box, a method for connecting them and the order of connecting them. However It is considered that any units which can optionally control the ratio of power and phase difference for one input are coordinated with the above-mentioned power distributer In the output distributer, all of the transformer for distribution of power, the phase control unit, and the matching box are not always necessary. A like effect can be obtained for example by simply branching the output from a matching box into two outputs. In this case, control of the distribution rate and phase difference is not easy and optimizing the conditions of plasma generation is not easy, but this system is suitable for a low cost system which is comparatively simple and is composed of few parts.

Power distributer 27 branches high frequency power Ph of the high frequency power source 6 into first and second power outputs Ph1 and Ph2 having optional ratio of power and phase difference, respectively, which can be supplied to second electrode 22 and first electrode 21. In this manner, the same action by one high frequency power source 6 as in the case of two high frequency powers 16 and 26 (FIG. 6) is possible. Accordingly except that the number of high frequency power sources is one, the use, operating procedure and operating state of this system is almost the same as that of the dry process system shown in FIG. 6.

Figure 9:
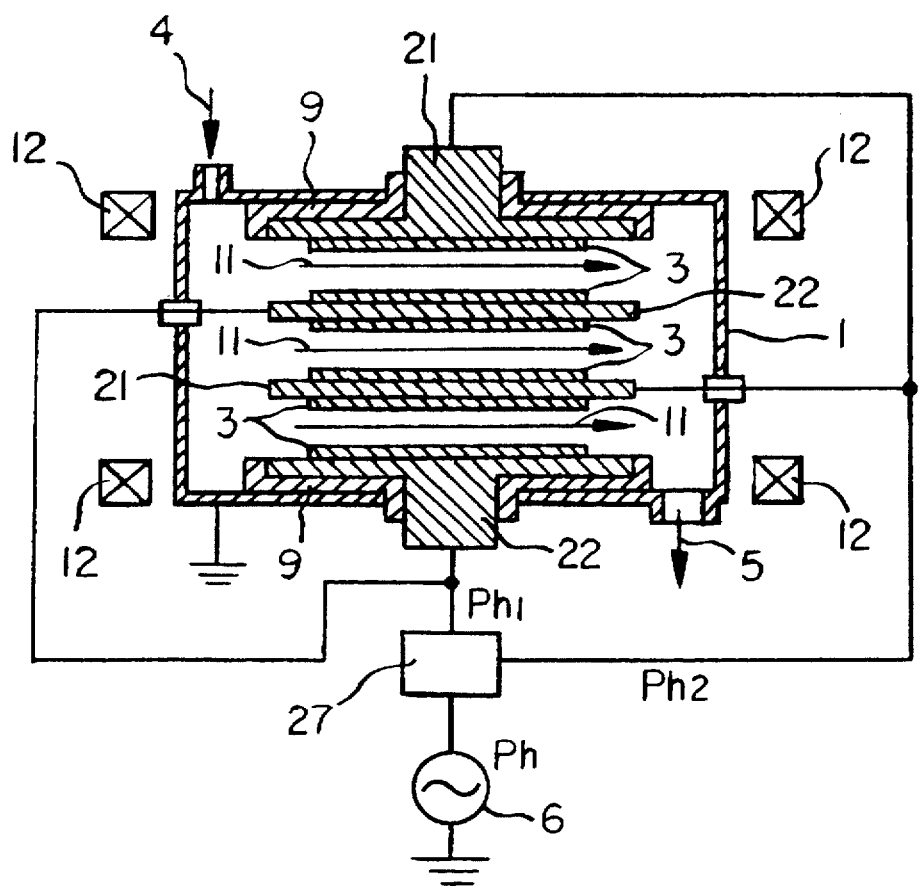
FIG. 9 is a schematic illustration of a seventh embodiment of a dry process system according to the present invention.

FIG. 9 is a schematic illustration of a seventh embodiment, in which the same reference characters of FIG. 8 designate the same or corresponding parts to the parts of the system shown in FIG. 8.

The seventh embodiment comprises two first electrodes 21 and two second electrodes 22 which are arranged alternately and parallel to each other in chamber 1 which is grounded. The first and second electrodes are connected through the power distributer 27 with high frequency power source 6. The other terminal of the high frequency power source is grounded. To equalize conditions of a plasma generated in each space between adjacent electrodes, it is preferable that respective distances between adjacent electrodes are equal to each other and areas of respective electrodes 21, 22 are almost equal to each other, and that the blocking capacitors incorporated in the output units of the power distributer for the first electrodes and the second electrodes are equal to each other.

The use, operating procedure and operating state are almost the same as that of the dry process system shown in FIG. 8. Further the number and state of arrangement of substrates 3 disposed on the electrodes, and method of supplying high frequency power to each electrode 21, 22 is the same as in the fifth embodiment.

In the first through the seventh embodiments, the high frequency power source is used as a power source for generating plasma. However the high frequency power source can be replaced by a low frequency power source.

Figure 10:
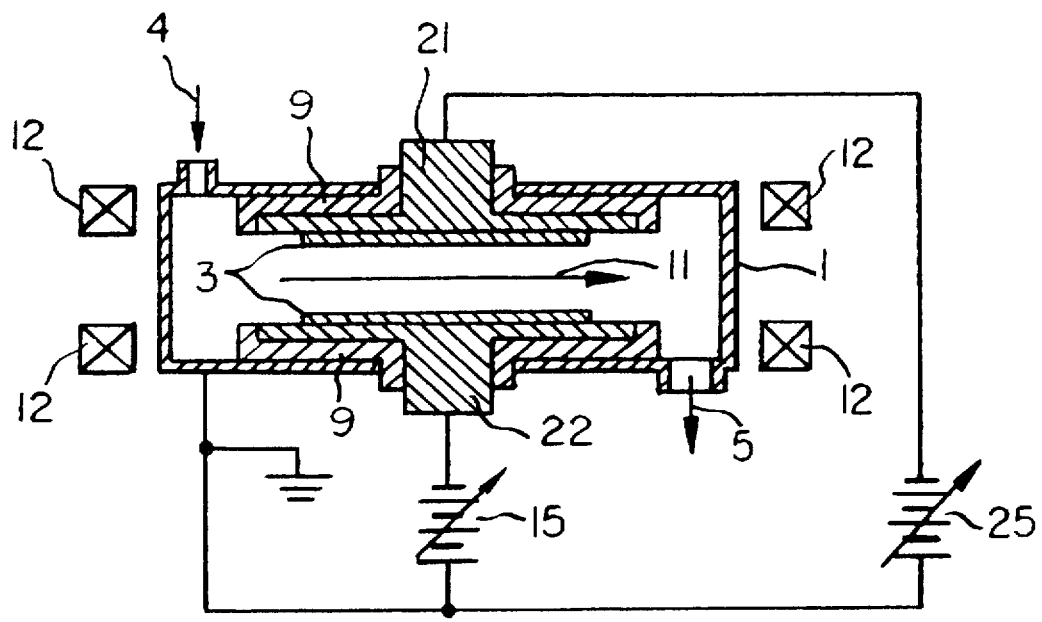
FIG. 10 is a schematic illustration of an eighth embodiment of a dry process system according to the present invention.

FIG. 10 is an illustration of an eighth embodiment of the present invention, in which the same reference characters as in FIG. 6 designate the same or corresponding parts as those of the system shown in FIG. 6.

The eighth embodiment comprises first electrodes 21 and second electrodes 22 which are arranged parallel to each other in chamber 1, first DC power source 15 the negative terminal of which is connected with second electrode 22 and second DC power source 25, the negative terminal of which is connected with first electrode 21. Positive terminals of DC power source 15, 25 are connected with chamber 1 or grounded. When the DC power sources are grounded, the chamber 1 is also grounded. To optionally control the power supplied to first electrode 21 and power supplied to second electrode 22, the output voltage of each DC power source 25, 15 should be optionally controllable. To control optionally the power supplied to first electrode 21 and power supplied to second electrode 22, in the eighth embodiment, two DC power sources are used. However by dividing the output from one DC power source into two by means of a potential divider to supply power to first and second electrodes 21, 22, the same action in the system is possible.

Further conditions for generating plasma are almost the same as that shown in the fourth and sixth embodiments.

Figure 11:
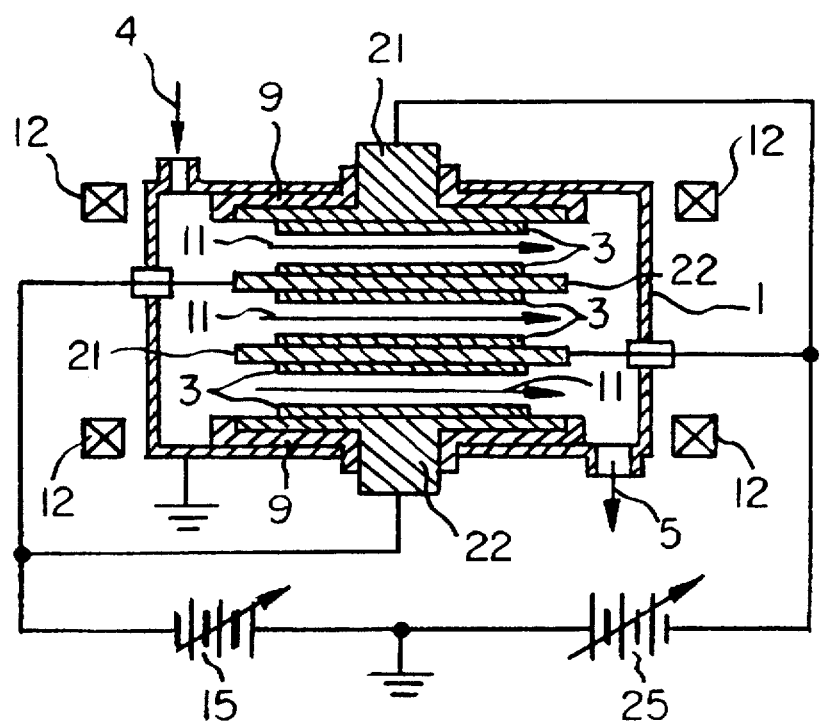
FIG. 11 is a schematic illustration of a ninth embodiment of a dry process system according to the present invention.

FIG. 11 is a schematic illustration of a ninth embodiment, in which the same reference characters of FIGS. 7 and 10 designate the same or corresponding parts to the parts of the systems shown in FIGS. 7 and 10.

The ninth embodiment comprises two first electrodes 21 and two second electrodes 22 which are arranged alternately and parallel to each other in the chamber 1. First electrodes 21 are connected with second DC power source 25 while second electrodes 22 are connected with first DC power source 15. To equalize the conditions of the plasma generated in each space between the adjacent electrodes, it is preferable that the respective distances between adjacent electrodes 21, 22 be almost equal to each other, and that the area of each electrode 21, 22 is almost equal to each other.

The use, operational procedure, and operational state are almost the same as in the dry process system shown in FIG. 10. Further the number and state of arrangement of electrodes in the system, the number and state of arrangement of substrates 3 disposed on the electrodes, and the method of supplying DC power to each electrode 21, 22 is the same as in the eighth embodiment.

Further in the fourth through the ninth embodiments, it is preferable that the gas pressure is under 1≈100 mTorr or 1 Pa (7.5 mTorr) and the distance between first and second electrode 21, 22 is about 10 mm to 30 mm. However if the gas pressure is lower and the mean free path is lengthened, the distance between first and second electrodes 21, 22 may be wider. It is advisable that the gas pressure is considered as being inversely proportional to the distance between electrodes to determine the gas pressure and the distance between adjacent electrodes. Further since the distance between the first and second electrodes 21, 22 is substantially equal to the diameter of rotation of electrons, if the distance between adjacent electrodes is made narrow, it is necessary to decrease the diameter of rotations of electrons by increasing the the magnetic field intensity, while the distance between electrodes is made wider, it is necessary to increase the diameter of rotation of electron by decreasing the magnetic field intensity. Magnetic field intensity is considered as being generally inversely proportional to the diameter of rotation of electrons. Accordingly, it is advisable that the magnetic field intensity is inversely proportional to the distance between the first and second electrodes and proportional to gas pressure. It is preferable that the magnetic field of about 150 to 200 gauss is applied, when the gas pressure is about 1 Pa and the distance between adjacent electrodes is about 10 to 30 mm.

Figure 15:
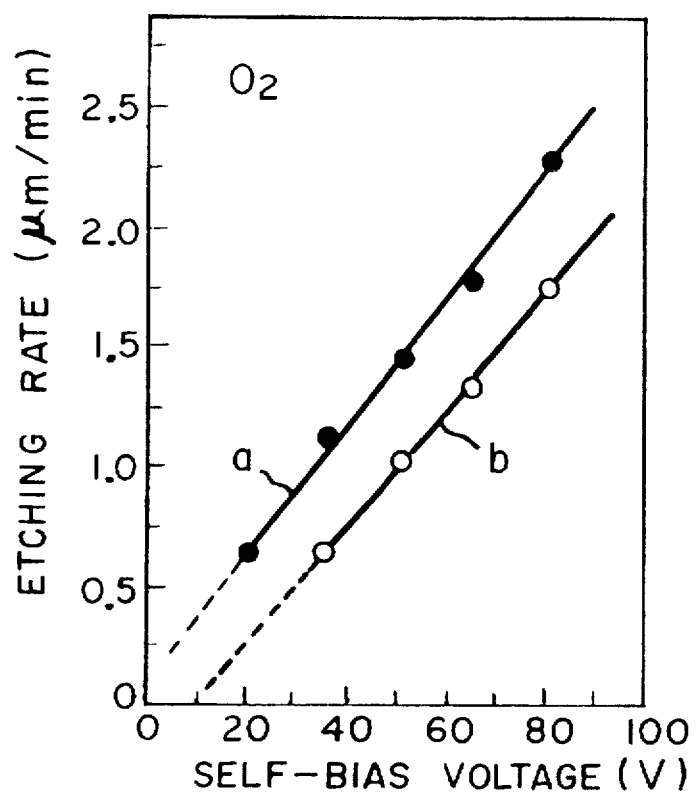
FIG. 15 is a graphical representation of self-bias voltages (V) to etching rate (μm/min) in a system according to the present invention and a conventional system.

FIG. 15 is a graphical representation of a self-bias voltage dependence of etching rate when a photo resist is etched by $O_2$ plasma.

In FIG. 15, line "a" shows etching rates of a photo resist by means of the dry process systems according to the present invention depending on the self-bias voltage and line "b" shows the etching rate of a photo resist by a conventional magnetron etching system. At a self-bias voltage of 35V, the etching rate of photo resist by means of the fourth to the ninth embodiments is higher by about two times the etching rate of a photo resist by a conventional magnetron etching system. At a self-bias voltage over 35 V, the etching rate of a photo resist by means of system according to the present invention is also higher by about forty percent than the etching rate of a photo resist by a conventional magnetron etching system. This difference in etching rate means a difference of plasma densities. It means that the dry process etching system according to the invention can produce a plasma having higher densities as compared with the conventional magnetron etching system.

The dry process systems of the fourth through the ninth embodiments can produce a high density plasma with fairly good uniformity, because a secondary electron emitted from each electrode 21, 22 is rotated by the action of magnetic field 11 in the space between the first and second electrodes and closed within said space. This plasma uniformities are by far superior to the usual magnetron plasma. This plasma uniformity can be further improved by rotating magnetic field 11 so that the magnetic field intensities are equalized. The plasma uniformity can be determined by etching substrates 3. Under a static magnetic field, when etching is carried out by the usual magnetron plasma, variations in the etching rate are ±35%, therefore the substrates are not processed to a close tolerance in contrast, under a static magnetic field, when etching is carried out by means of the dry process systems according to the present invention, variations in etching rate are ±15%, therefore the substrates can be processed to fairly close tolerance. Further under a rotary magnetic field, plasma uniformity is further improved to such an extent that excellent etching uniformity of ±3% can be obtained by using the dry process systems according to the present invention.

Figure 16:
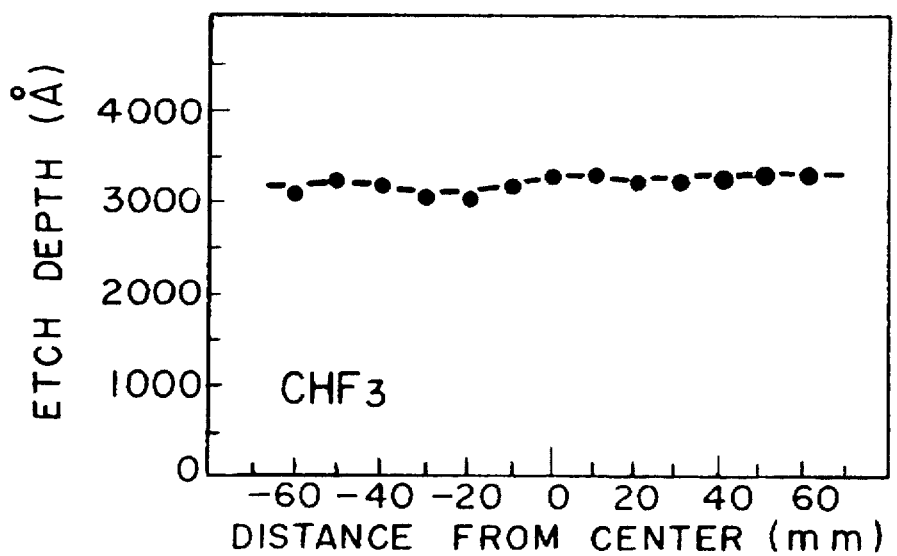
FIG. 16 is a graphical representation of etch depth distribution of a 6-inch $SiO_2$ wafer etched under rotating magnetic field.

FIG. 16 is a graphical representation of the etch depth distributions of a 6 inch $SiO_2$ substrate etched with $CHF_3$ gas introduced into the dry process systems of the fourth to the ninth embodiments of the present inventions, wherein etching time is about one minute and the magnetic field is rotated. Since magnetic field is rotated, variations in etching accuracy are distributed almost symmetrically with respect to the central axis within the substrates. An etching uniformity is about ±4. Thus, the dry process system according to the present invention can produce a more uniform magnetron plasma as compared with a conventional dry process system.

Since the gas pressure at which a magnetron discharge is obtained is fairly low, under about 1 Pa (7.5 mTorr) very directional etching is possible, and it is possible to produce a thin film of high quality and including a small quantity of impurities. Further since plasmas having almost the same conditions can be obtained in the neighborhood of first and second electrodes 21, 22, more than two substrates 3 disposed on respective electrodes 21, 22 can be processed at the same time.

Further since a magnetic field is applied almost parallel with substrates 3, electrons in a plasma are difficult to flow toward the substrates, so an ion sheath is hard to form. Therefore since a self-bias voltage decreases to less than ⅕ of that in a conventional dry process system so that damage caused by ions incident on the substrates are decreased. For this reason, the dry process systems according to the present invention are suitable, particularly for etching with a low rate of damage generation, in vapor deposition of material for a gate, an trench etching or lead. Further according to the present invention, miniaturization of the dry process system becomes possible.

This invention is not to be limited by the embodiment shown in the drawings and described in the description, which is given by way of example and not of limitation, but only in accordance with the scope of the appended claims.

What is claimed is:

1. A dry process system comprising; a chamber having a reaction gas inlet and an exhaust gas outlet; at least one pair of substantially parallel electrodes; at least one of the electrodes being adapted to receive a substrate for processing; alternating current power source means; a blocking capacitor connecting each electrode of said at least one pair of substantially parallel electrodes to said alternating current power source means; magnetic field applying means for applying a magnetic field substantially parallel to said at least one pair of substantially parallel electrodes; the spacing between electrodes of said at least one pair of parallel electrodes being set to be substantially equal to a mean free path of electrons emitted from the electrodes; reaction gas supplying means for supplying a reaction gas at a predetermined pressure; wherein all of said at least one pair of parallel electrodes are cathodes; whereby a uniform high density plasma is generated between said at least one pair of substantially parallel electrodes.

2. A dry process system according to claim 1 in which the alternating current power source means supplies synchronous power at a 0 degree phase difference to each electrode of said at least one pair of substantially parallel electrodes.

3. A dry process system according to claim 1 in which the alternating current power source means supplies synchronous power at a 180 degree phase difference to each electrode of said at least one pair of electrodes.

4. A dry process system according to claim 1 in which the alternating current power source means supplies synchronous power at a phase difference of between −40 degrees to +40 degrees to each electrode of said at least one pair of substantially parallel electrodes.

5. A dry process system according to claim 1 in which the alternating current power source means supplies synchronous power at a phase difference of between 140 degrees to 220 degrees to each electrode of said at least one pair of substantially parallel electrodes.

6. A dry process system according to claim 1 in which the alternating current power source means supplies synchronous power at a predetermined power ratio to each electrode of said at least one pair of substantially parallel electrodes.

7. A dry process system according to claim 1 in which the alternating current power source means are a pair of power sources supplying power to said at least one pair of substantially parallel electrodes respectively.

8. A dry process system according to claim 1 further comprising power distribution means for selectively controlling the power ratio and phase of power applied by said alternating power source to each of said at least one pair of substantially parallel electrodes.

9. A dry process system according to claim 1 in which said reaction chamber is grounded.

10. A dry process system according to claim 1 in which said at least one pair of substantially parallel electrodes are more than two pairs and a total number of electrodes are greater than three.

11. A dry process system according to claim 10 in which the space between electrodes of each pair of the more than two pairs of electrodes is equal.

12. A dry process system according to claim 1 in which the space between electrodes of said at least one pair of substantially parallel electrodes is selected to be between approximately 10 to 50 mm.

13. A dry process system comprising; a chamber having a reaction gas inlet and an exhaust gas outlet; at least one pair of substantially parallel electrodes; at least one of the electrodes being adapted to receive a substrate for processing; direct current power source means for supplying negative power to each electrode of the said at least one pair of substantially parallel electrodes; magnetic field applying means for applying a magnetic field substantially parallel to said pair of substantially parallel electrodes; the spacing between electrodes of said at least one pair of parallel electrodes being set to be substantially equal to a mean free path of electrons emitted from the electrodes; reaction gas supplying means for supplying a reaction gas at a predetermined pressure; wherein all of said at least one pair of parallel electrodes are cathodes; whereby a uniform high density plasma is generated between said at least one pair of substantially parallel electrodes.

14. A dry process system according to claim 13 in which the direct current power source means supplies negative power at a predetermined power ratio to each electrode of said at least one pair of substantially parallel electrodes.

15. A dry process system according to claim 13 in which the at least one pair of substantially parallel electrodes are more than two pairs and a total number of electrodes are greater than three.

16. A dry process system according to claim 15 in which the space between electrodes of each pair of the more than two pairs of electrodes is equal.

17. A dry process system according to claim 13 in which the space between electrodes of said at least one pair of substantially parallel electrodes is selected to be between approximately 10 to 50 mm.

* * * * *

UNITED STATES PATENT AND TRADEMARK OFFICE
CERTIFICATE OF CORRECTION

PATENT NO.  : 5,795,452
DATED       : August 18, 1998
INVENTOR(S) : Haruhisa Kinoshita; Osamu Matsumoto; Harunobu Sakuma It is certified that error appears in the above-identified patent and that said Letters Patent is hereby corrected as shown below:

```
Column 2, line 53, change "," to --.--.
Column 3, line 45, after "of" insert --the--.
Column 4, line 2,  delete "that is a mean free path of the
                   electrons".
          line 4, after "electrons", insert
                   --that is a mean free path of the electrons".
          line 7, after "nearly" insert --equal--.
          line 21, after "rotating" insert --without drifting
                   very far right and left in the space--.
          line 37, delete "electrons can drift".
          line 50, after "alternating" insert --current--.
Column 5, line 67, after "high" insert --frequency--.
Column 7, line 26, after "collision," insert
                   --that is the mean free path of electrons--.

Column 10, line 7, after "In the above", insert --described--.
Column 11, lines 65 and 66, change "°±40° from 10°" to
                   --0 ± 40° from 0°--.
```

Signed and Sealed this

Second Day of February, 1999

Attest:

Attesting Officer

*Acting Commissioner of Patents and Trademarks*